(12) United States Patent
Sekiya

(10) Patent No.: US 7,608,483 B2
(45) Date of Patent: Oct. 27, 2009

(54) METHOD OF MACHINING WAFER

(75) Inventor: Kazuma Sekiya, Ota-Ku (JP)

(73) Assignee: Disco Corporation, Tokyo (JP)

( * ) Notice: Subject to any disclaimer, the term of this patent is extended or adjusted under 35 U.S.C. 154(b) by 29 days.

(21) Appl. No.: 12/126,261

(22) Filed: May 23, 2008

(65) Prior Publication Data

US 2008/0305578 A1    Dec. 11, 2008

(30) Foreign Application Priority Data

Jun. 5, 2007   (JP) .............................. 2007-149082

(51) Int. Cl.
*H01L 21/50*   (2006.01)
(52) U.S. Cl. ...................... 438/113; 438/459
(58) Field of Classification Search ................. 438/106, 438/107, 110, 113, 459, 460, 462
See application file for complete search history.

(56) References Cited

U.S. PATENT DOCUMENTS 6,936,499 B2 * 8/2005 Shibata et al. .............. 438/108
7,278,903 B2 * 10/2007 Masuda ....................... 451/11
7,384,812 B2 * 6/2008 Misawa ....................... 438/66
7,462,094 B2 * 12/2008 Yoshida et al. ................ 451/41
7,527,547 B2 * 5/2009 Kajiyama et al. ............. 451/41
2007/0093040 A1 * 4/2007 Sekiya ....................... 438/460
2008/0318362 A1 * 12/2008 Miyazaki et al. ............ 438/113

FOREIGN PATENT DOCUMENTS

JP    A 2006-303051    11/2006

* cited by examiner

*Primary Examiner*—Savitri Mulpuri
(74) *Attorney, Agent, or Firm*—Greer, Burns & Crain, Ltd

(57) ABSTRACT

A method of machining a wafer, wherein a wafer provided with devices each having a low dielectric constant insulating film (low-k film) stacked on the face side thereof is divided into the individual devices, the devices thus divided are mounted on a wiring board, and then a grindstone is brought into contact with each of the mounted devices from the side of a side surface of the devices, to grind the back side of the device by a desired amount. Since no vertical load is exerted on the low-k film, the low-k film can be prevented from being broken, and device quality is not lowered.

1 Claim, 10 Drawing Sheets

METHOD OF MACHINING WAFER

BACKGROUND OF THE INVENTION

1. Field of the Invention

The present invention relates to a method of machining a wafer provided with devices each having a low dielectric constant insulating film.

2. Description of the Related Art

A wafer provided with devices such as ICs and LSIs on the face side thereof is machined into a desired thickness by grinding the back side thereof, and is then divided into the individual devices by dicing. The grinding of the back side of the wafer is conducted by a method in which a grinding stone being rotated is brought into contact with the back side of the wafer and is pressed in the thickness direction of the wafer (refer to Japanese Patent Laid-open No. 2006-303051).

However, the individual devices may include those of the type in which a low dielectric constant insulating film (low-k film) is adopted as a layer insulating film in a multi-layer wiring for enhancing operating speed through prevention of the wiring delay. In the case of the devices in which the low-k film is adopted, grinding the wafer by pressing a grinding stone against the wafer from the back side of the wafer may result in that the low-k film is broken by the pressure in the thickness direction exerted during grinding, leading to a lowered device quality.

SUMMARY OF THE INVENTION

Accordingly, it is an object of the present invention to provide a method of machining a wafer which ensures that, in grinding the back side of devices each having a low-k film, the low-k film is prevented from being broken.

In accordance with an aspect of the present invention, there is provided a method of machining a wafer, for dividing a wafer in which a plurality of devices each having a low-k film stacked on the face side thereof are formed in the state of being demarcated by planned dividing lines, into the individual devices and for causing the wafer to have a desired thickness, wherein the method includes: a dividing step for dividing the wafer into the individual devices; a bonding step for bonding electrodes of the divided devices to electrodes of a wiring board and for filling a gap between the wiring board and each of the bonded devices with a resin for sealing; and a device grinding step for holding on a chuck table of a grinding apparatus the wiring board with the devices bonded thereto, and moving the wiring board in a horizontal direction in such a manner that a grinding stone fixed at a predetermined height is brought into contact with each of the devices from a side surface of the device to grind the back side of the device, thereby grinding the device by a desired amount.

Preferably, the device grinding step includes a first grinding step for rough grinding each device by using a rough grinding stone and a second grinding step for finish grinding each device by using a finish grinding stone.

According to the present invention, before grinding of the wafer, the wafer is divided into the individual devices, the electrodes of the devices are bonded to the electrodes of the wiring board, and the gap between the wiring board and each of the devices is filled with a resin for sealing, thereby protecting the low-k film, and the device in this condition is gradually ground from the side surface thereof. Therefore, no vertical load is exerted on the low-k film, so that the low-k film can be prevented from being broken, and device quality can be prevented from being lowered.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
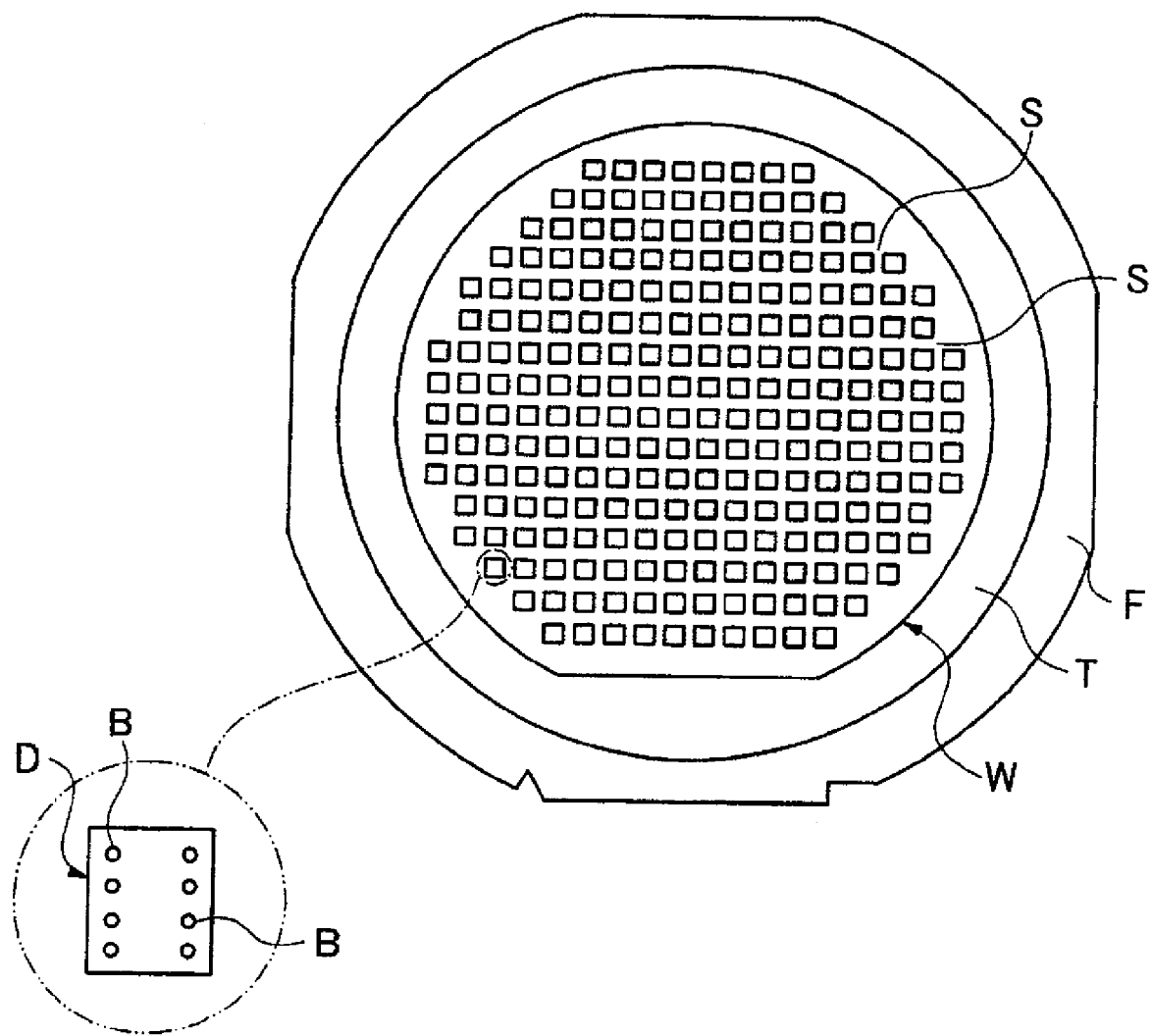
FIG. 1 is a plan view showing the condition where a wafer provided with bumps is held on a frame.

A wafer W shown in FIG. 1 is a wafer in which devices D each having a low dielectric constant insulating film (low-k film) stacked on the face side thereof are formed in the state of being demarcated by planned dividing lines S, and each of the devices D is provided at the face side thereof with bumps B, which are electrodes. The individual devices D are flip chips to be mounted directly onto a wiring board, and, before dividing the wafer W into the devices D, the wafer W is adhered to a tape T, to be united to and supported by a frame, which is adhered to an outer peripheral part of the tape T, through the tape T.

Figure 2:
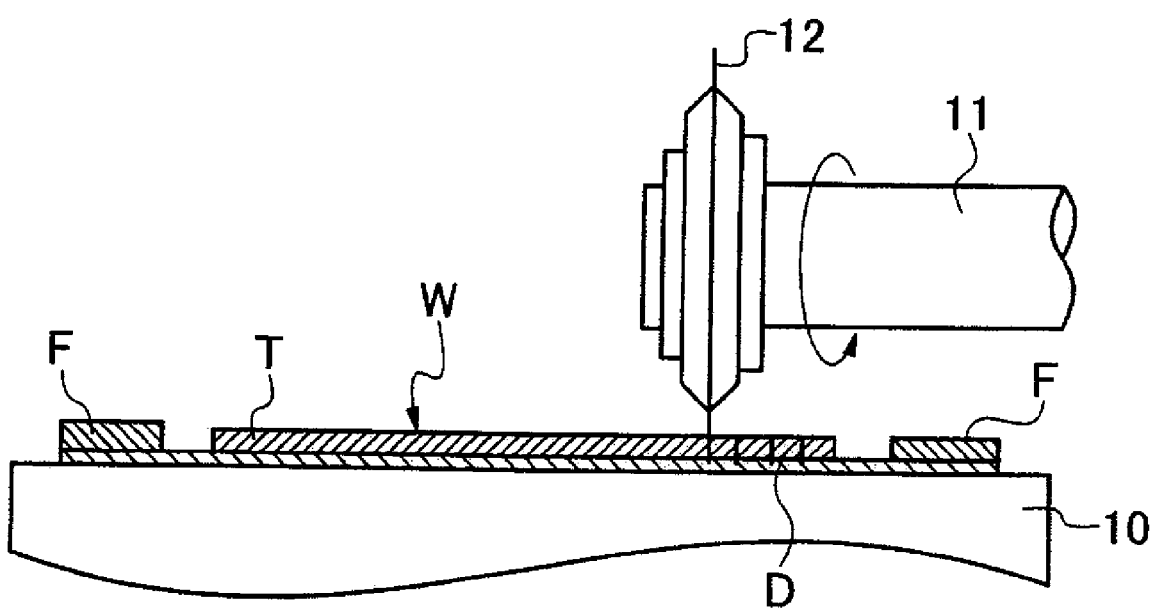
FIG. 2 is a sectional view schematically showing the condition in which the wafer is cut.
Figure 3:
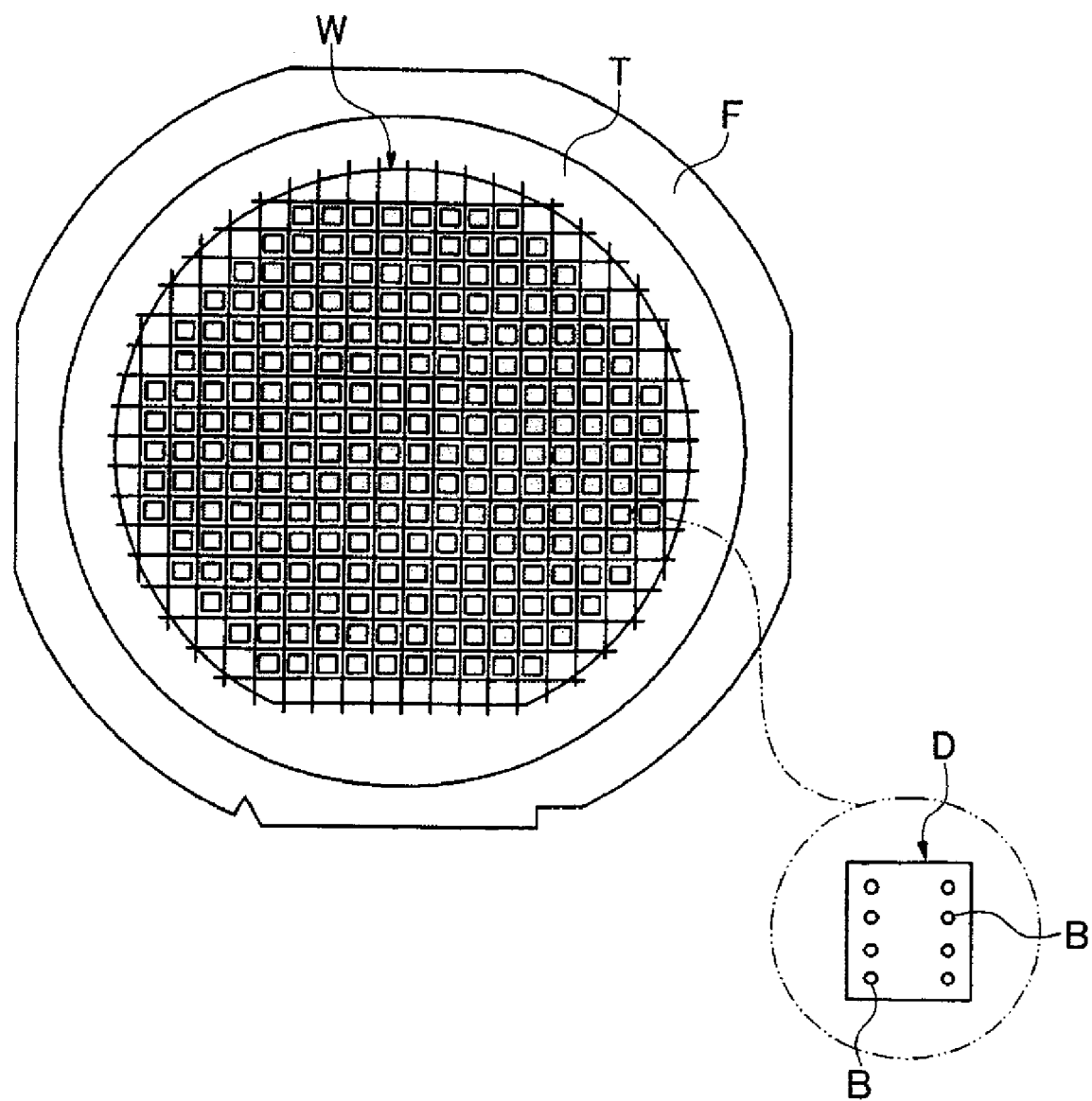
FIG. 3 is a plan view showing the cut wafer.

The wafer W supported on the frame F through the tape T is held by a holding table 10 of a cutting apparatus, as shown in FIG. 2. Then, the holding table 10 is moved in the direction perpendicular to the surface of the sheet of drawing, and a cutting blade 12 mounted to a spindle 11 and rotated at high speed is cause to cut the wafer W along each of planned dividing lines S, whereby the wafer W is cut in crossing directions (directions orthogonal to each other) along all the planned dividing lines S into the individual devices D (dividing step), as shown in FIG. 3.

Figure 4:
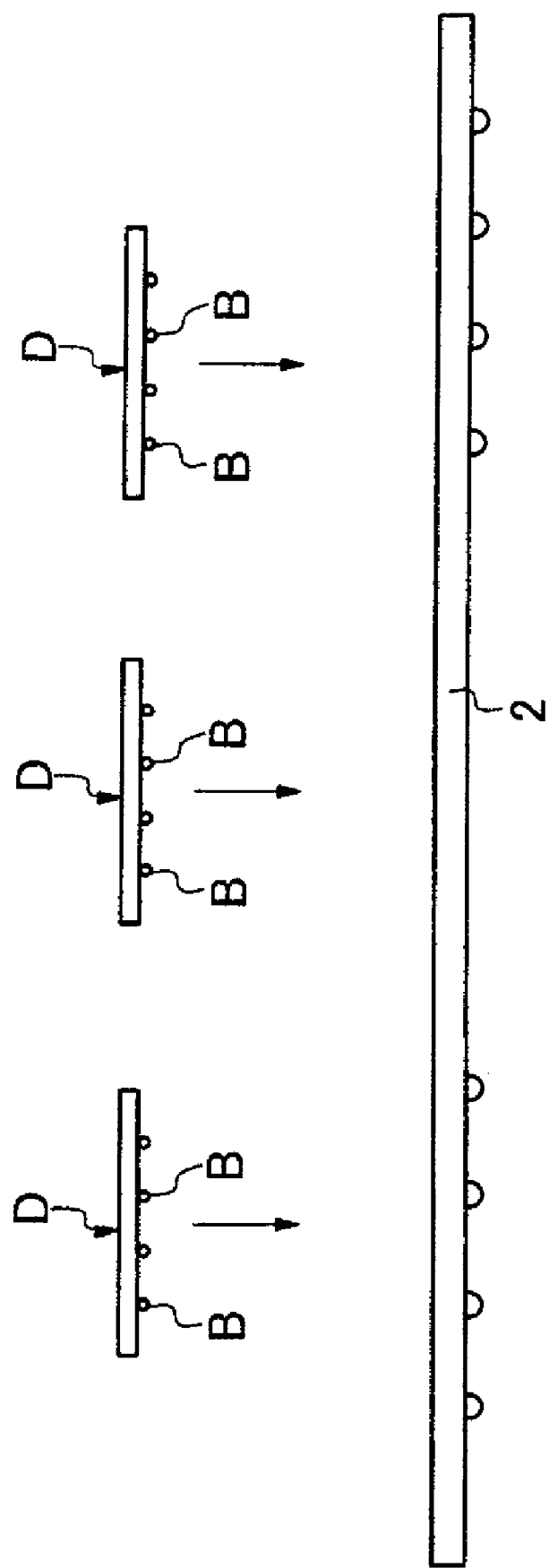
FIG. 4 is a front view showing the condition in which the devices are mounted onto a wiring board.
Figure 5:
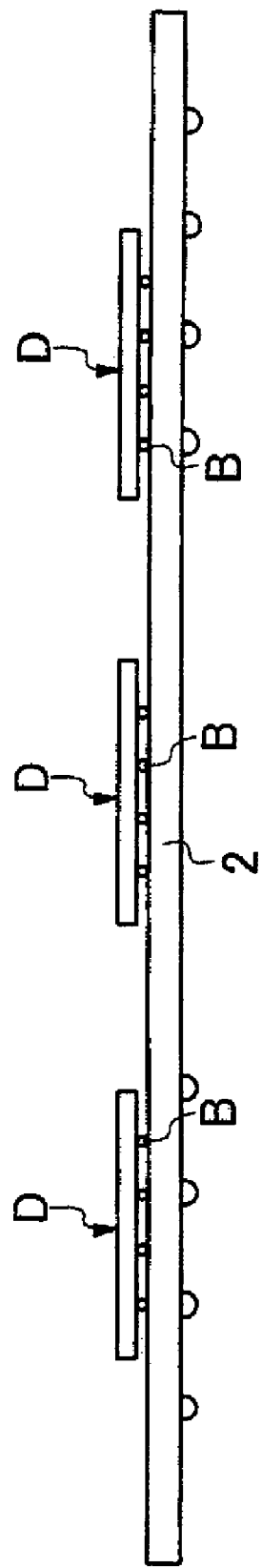
FIG. 5 is a front view showing the condition where the electrodes of the devices are bonded to electrodes of the wiring board.
Figure 6:
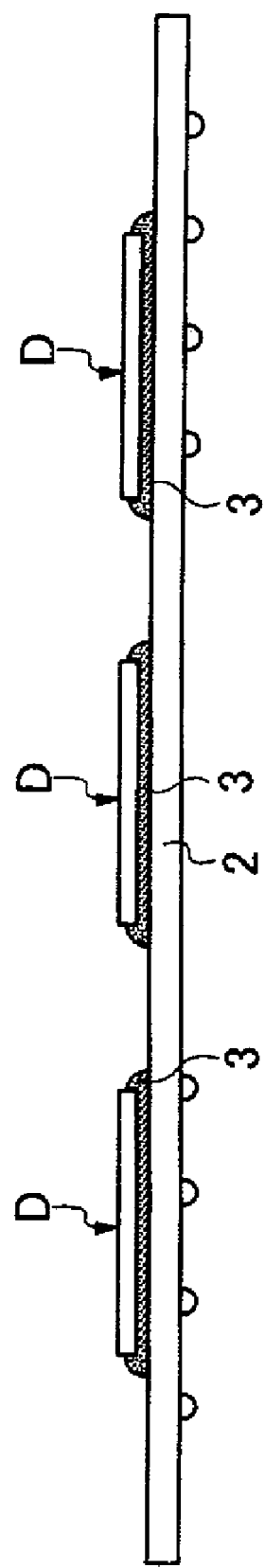
FIG. 6 is a front view showing the condition where a gap between each of the devices and the wiring board is filled with a resin for sealing.
Figure 7:
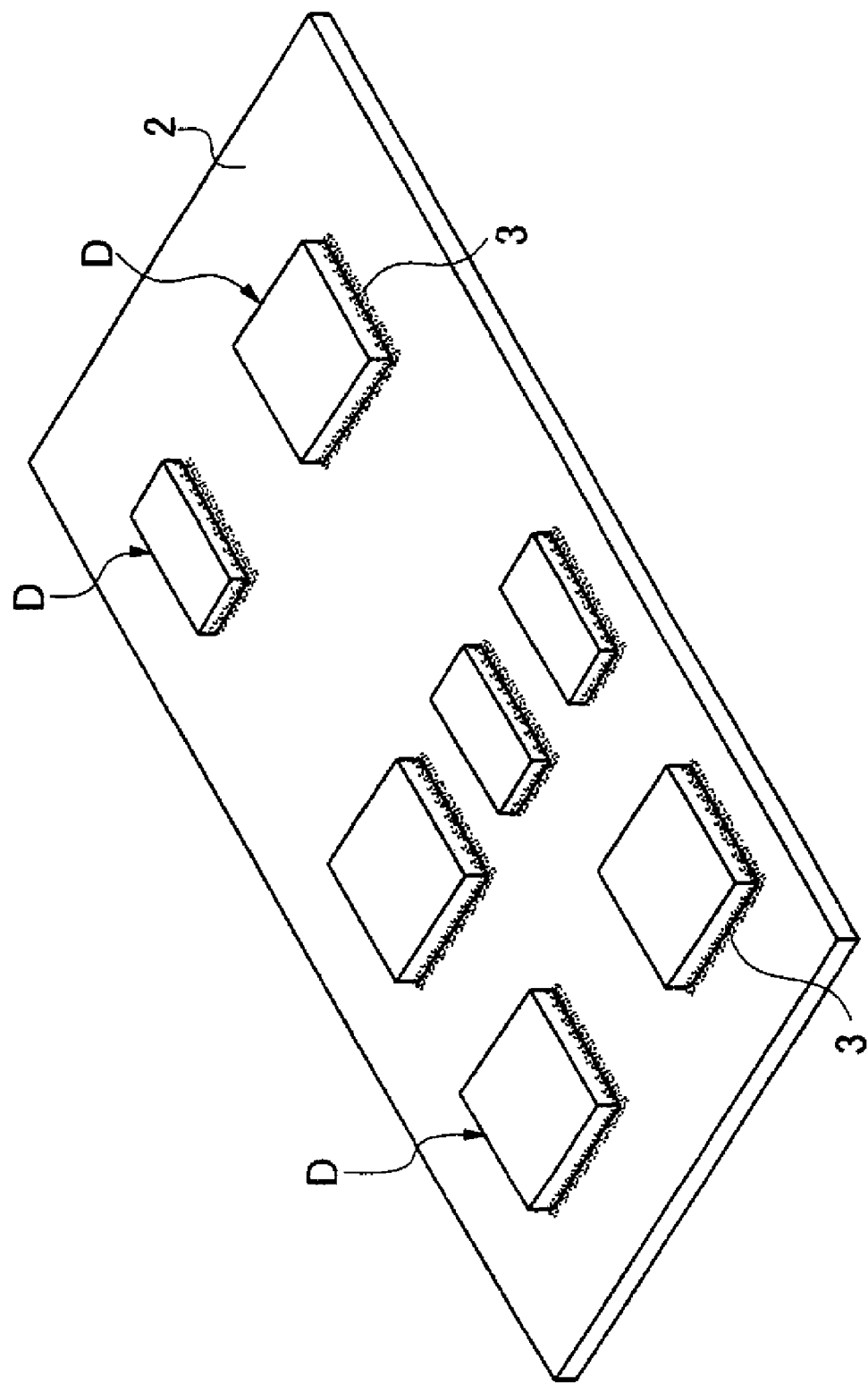
FIG. 7 is a perspective view showing the condition where the gap between each of the devices and the wiring board is filled with the resin for sealing.

As shown in FIGS. 4 and 5, the bumps B formed on the devices D are bonded to electrodes of a wiring board 2. Then, as shown in FIG. 6, the gap between each of the bonded devices D and the wiring board 1 is filled with a resin 3 for sealing, whereby the low-k film on the face side of each device D is protected (bonding step). As shown in FIG. 7, the plurality of devices D thus bonded and sealed with the resin may differ in size and/or shape. Next, the back side (exposed side) of each of the devices D is ground to make the device D have a desired thickness. This grinding is carried out, for example, by use of a grinding apparatus 4 shown in FIG. 8.

Figure 8:
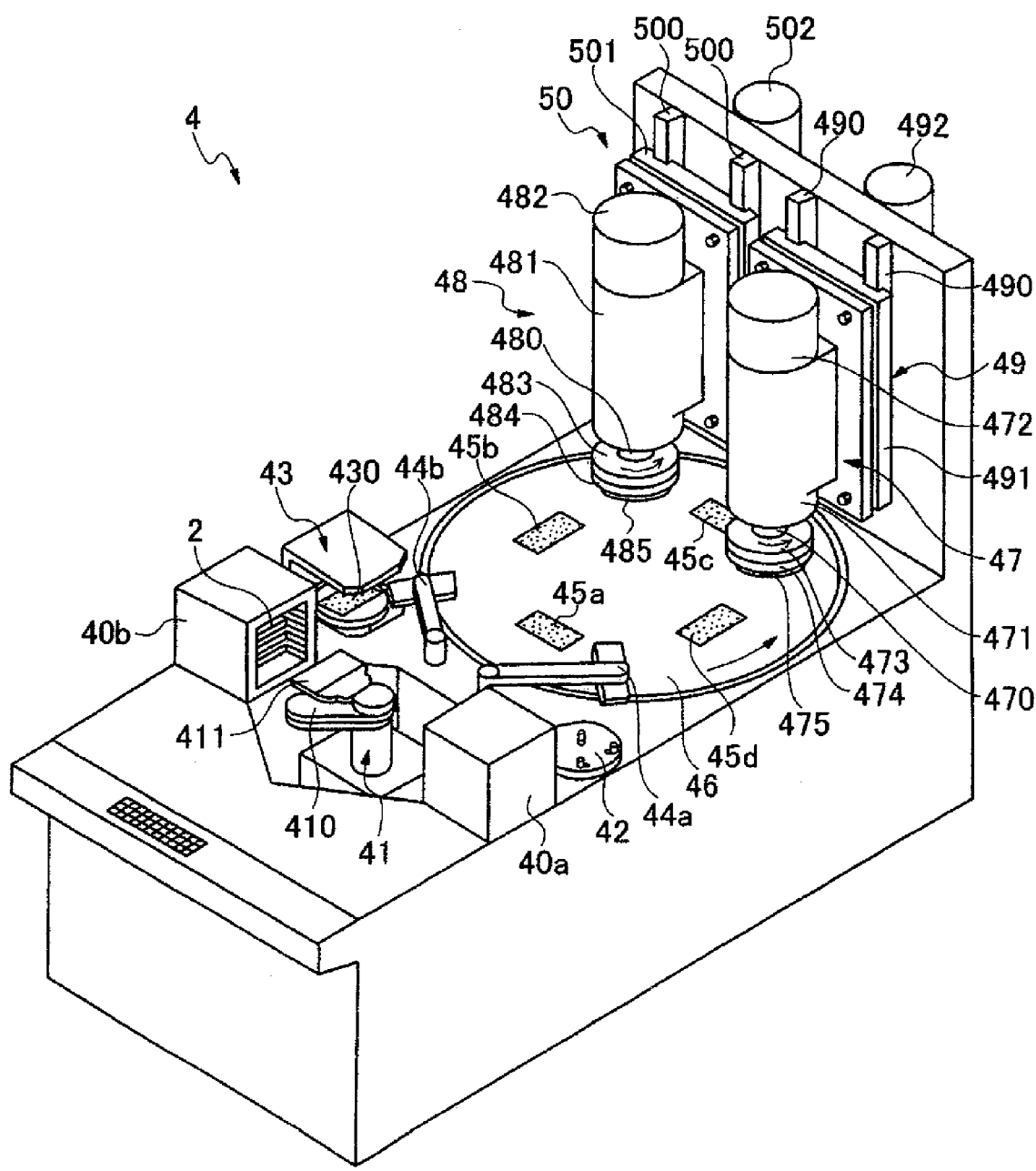
FIG. 8 is a perspective view of an example of a grinding apparatus.

The grinding apparatus 4 shown in FIG. 8 includes a first cassette 40a for containing the wiring boards 2 with the devices D mounted thereon which are to be subjected to grinding, and a second cassette 40b for containing the wiring boards 2 which have been subjected to device grinding. In the vicinity of the first cassette 40a and the second cassette 40b, feeding-in/out means 41 is disposed by which the wiring board 2 to be subjected to device grinding is fed out of the first cassette 40a and by which the wiring board 2 having been subjected to device grinding is fed into the second cassette 40b. The feeding-in/out means 41 has a configuration in which a holding part 411 for holding the wafer is provided at the tip of a bendable arm 410, and, in the moving range of the holding part 411, there are disposed aligning means 42 for aligning the wafer before machining and cleaning means 43 for cleaning the machined wafer.

First feeding means 44a is disposed in the vicinity of the aligning means 42, and second feeding means 44b is disposed in the vicinity of the cleaning means 43. The first feeding means 44a has the function of feeding the wiring board 2 mounted on the aligning means 42 to one of chuck tables 45a, 45b, 45c and 45d, and the second feeding means 44b has the function of feeding the machined wafer held on one of the chuck tables 45a, 45b, 45c and 45d to the cleaning means 43.

The chuck tables 45a, 45b, 45c and 45d for holding the wiring board 2 are formed in a shape corresponding to the shape of the wiring board 2, and is so supported as to be revolved by a turntable 46. In addition, first grinding means 47 and second grinding means 48 are disposed on the upper side of the moving path of the chuck tables 45a, 45b, 45c and 45d.

The first grinding means 47 includes a spindle 470 having an axis set vertical, a spindle housing 471 for rotatably supporting the spindle 470, a motor 472 connected to one end of the spindle 470, a wheel mount 473 provided at the other end of the spindle 470, and a grinding wheel 474 mounted to the wheel mount 473, and is so configured that the spindle 470 is rotated by driving of the motor 472, and the grinding wheel 474 is also rotated attendantly. A first grindstone 475 is securely attached to the lower surface of the grinding wheel 474. As the first grindstone 475, for example, a grinding stone for rough machining is used.

The first grinding means 47 can be driven by first height control means 49 to move vertically. The first height control means 49 includes guide rails 490 disposed vertically, a lift plate 491 which makes sliding contact with the guide rails 490 and to which the first grinding means 47 is secured, and a pulse motor 492 for moving the lift plate 491 upward and downward, and is so configured that driven by the pulse motor 492, the lift plate 491 is moved upward or downward while being guided by the guide rails 490, and, attendantly, the first grinding means 47 is also moved upward or downward. The pulse motor 492 is controlled by pulses outputted from a control unit (not shown). In addition, the position in the vertical direction of the first grinding stone 475 constituting the first grinding means 47 is controlled by the pulse motor 492.

The second grinding means 48 includes a spindle 480 having an axis set vertical, a spindle housing 481 for rotatably supporting the spindle 480, a motor 482 connected to one end of the spindle 480, a wheel mount 483 provided at the other end of the spindle 480, and a grinding wheel 484 mounted to the wheel mount 483, and is so configured that by driving of the motor 482, the spindle 480 is rotated, and the grinding wheel 484 is also rotated attendantly. A second grindstone 485 is secured to the lower surface of the grinding wheel 484. As the second grindstone 485, for example, a grinding stone for finish grinding is used.

The second grinding means 48 can be driven by second height control means 50 to move vertically. The second height control means 50 includes guide rails 500 disposed vertically, a lift plate 501 making sliding contact with the guide rails 500, and a pulse motor 502 for moving the lift plate 501 upward and downward, and is so configured that driven by the pulse motor 502, the lift plate 501 is moved upward or downward, and, attendantly, the second grinding means 48 is also moved upward or downward. The pulse motor 502 is controlled by pulses outputted from the control unit (not shown). In addition, the position in the vertical direction of the second grindstone 485 constituting the second grinding means 48 is controlled by the pulse motor 502.

The wiring board 2 contained in the first cassette 40a is fed by the feeding-in/out means 41 to the aligning means 42, to be aligned to a predetermined position, and is then fed to the chuck table 45a by the first feeding means 44a. At the chuck table 45a, the back side (the side on which the devices D are not mounted) of the wiring board 2 is held, so that the back side of each of the devices D is exposed.

Figure 9:
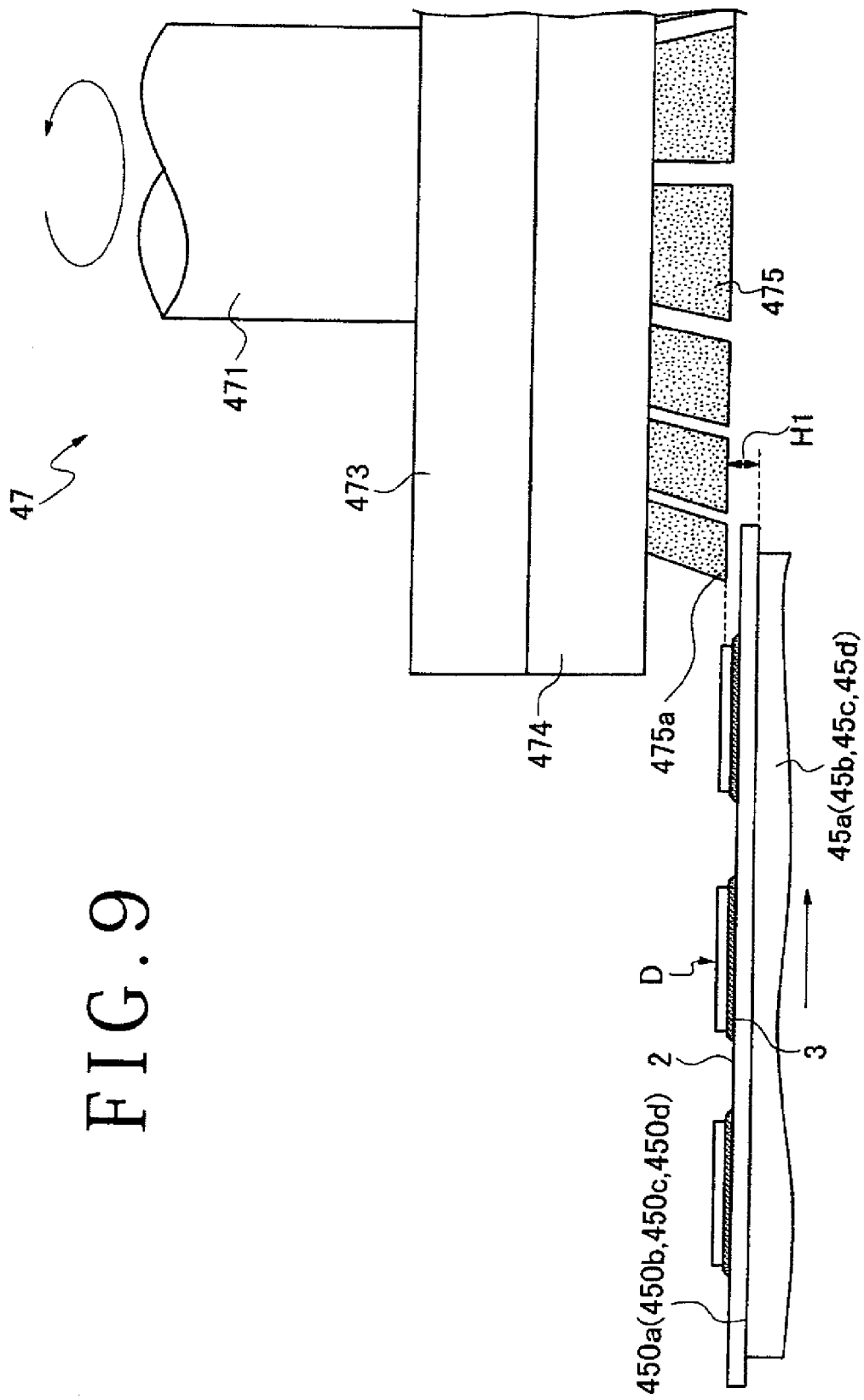
FIG. 9 is an illustration of the condition in which the device is ground by first grinding means.

The first height control means 49 shown in FIG. 8 performs such a control that the height of the lower surface of the first grindstone 475 is fixed at a predetermined position. This predetermined position varies according to the desired thickness of the device D after grinding. For example, in the case where a holding surface 450a of the chuck table 45a is adopted as an origin in height control and where the device D is to be ground to a height which is higher than the origin by H1 (for example, 1150 μm) as shown in FIG. 9, the first grinding means 47 is so controlled that the lower surface of the first grindstone 475 is fixed at the position higher than the origin by H1. The value of H1 can be obtained, for example, by measuring the height of the back side of the device D above the holding surface 450a by a probe type thickness meter, and subtracting a desired grinding amount to be obtained by the first grinding means 47 from the measured value. Incidentally, while the first grindstone 475 in the example shown in FIG. 9 has an outer periphery gradually increased in diameter along the downward direction to form a sharp part 475a, the first grindstone 475 may have a shape without such an increase in diameter.

Figure 10:
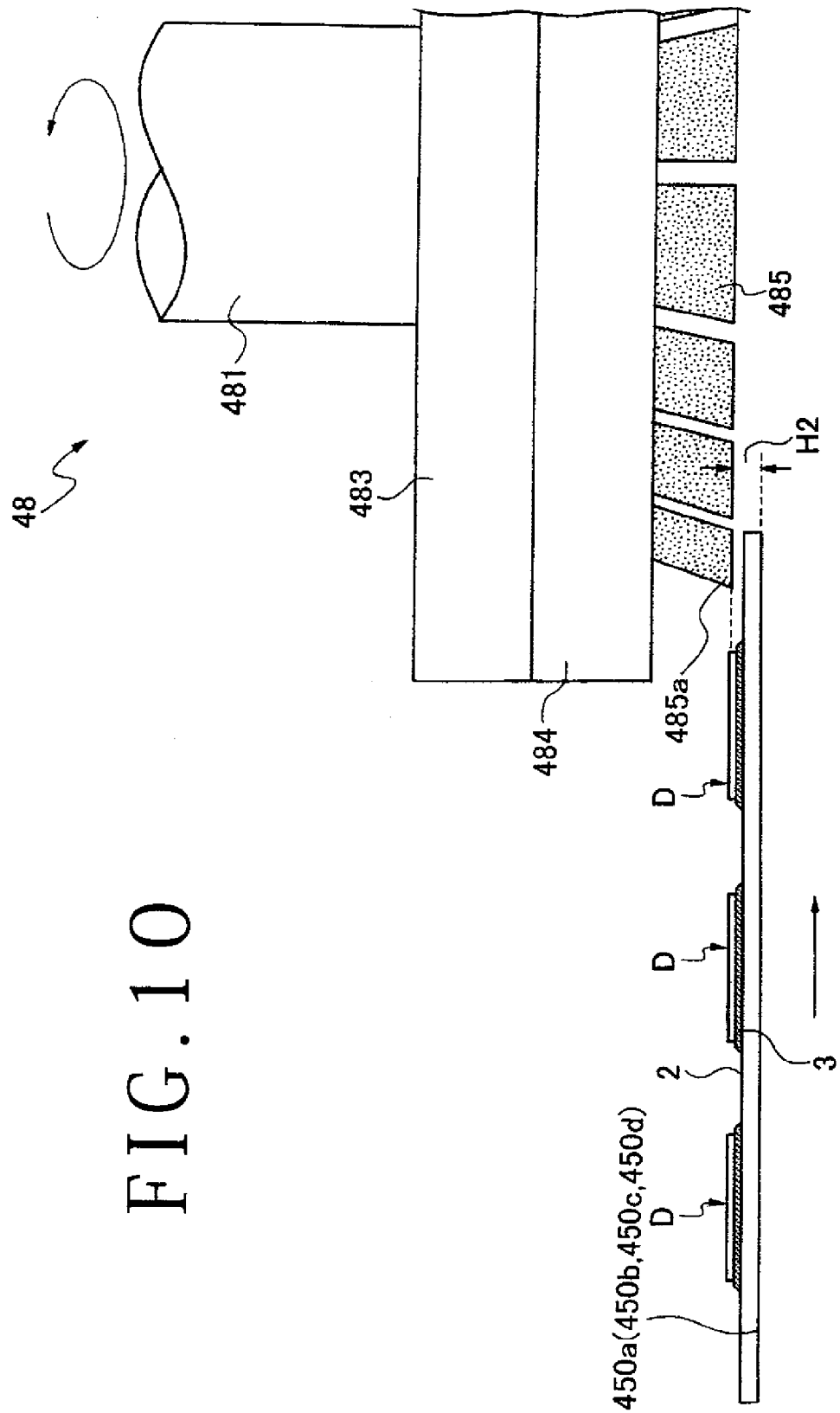
FIG. 10 is an illustration of the condition in which the device is ground by second grinding means.

In addition, the second height control means 50 is also so controlled that the height of the lower surface of the second grindstone 485 is positioned at a predetermined position. For example, in the case where a holding surface 450a of the chuck table 45a is adopted as an origin as shown in FIG. 10 and where the device D is to be ground to a height which is higher than the origin by H2 (for example, 1100 μm) as shown in FIG. 10, the second grinding means 48 is so controlled that the lower surface of the second grindstone 485 is fixed at the position higher than the origin by 1100 μm. The value of H2 can be obtained by the same method as for H1. Incidentally, while the second grindstone 485 in the example shown in FIG. 10 has an outer periphery gradually increased in diameter along the downward direction to form a sharp part 485a, the second grindstone 485 may have a shape without such an increase in diameter.

The grinding wheels 474, 484 are rotated by rotating the spindles 471, 481 in the condition where the grindstones 475, 485 are fixed at respective predetermined positions as above-mentioned, and the wiring board 2 held on the chuck table 45a is put into revolution by rotating the turntable 46 counter-clockwise. This ensures that, as shown in FIG. 9, the sharp part 475a of the grindstone 475 first makes contact with a side surface of the device D, and, by the further rotation of the turntable 46, the device D is gradually ground horizontally from the side surface thereof, to be ground to the position which is at a height of H1 (1150 μm) above the holding surface 450a of the chuck table 45a. The grinding from the side surface ensures that no vertical load in the thickness direction is exerted on the low-k film of the device D, so that the low-k film is prevented from being damaged. In addition, with the sharp part 475a provided, the grinding can be started smoothly. Incidentally, in this instance, the wiring board on which the device to be ground next is mounted is taken out of the cassette 40a by the feeding-in/out means 41, is fed through the aligning means 42, and is mounted onto the chuck table 45b by the first feeding means 44a, to be held on the chuck table 45b.

When the turntable 46 is further rotated continuously in the same direction, the sharp part 485a of the second grindstone 485 constituting the second grinding means 48 comes into contact with a side surface of the device D. With the turntable 46 rotated further, the device D is gradually ground horizontally from the side surface thereof, and is ground to the position which is at a height H2 (1100 μm) above the holding surface 450a of the chuck table 45a, to be formed into a desired thickness (grinding step). The grinding from the side surface ensures that no vertical load in the thickness direction is exerted on the low-k film of the device P, so that the low-k film is prevented from being damaged. Besides, with the sharp part 485a provided, the grinding can be started smoothly. Incidentally, in this instance, the wiring board on which the device to be ground next is mounted is taken out of the cassette 40a by the feeding-in/out means 41, is fed through the aligning means 42, and is mounted onto the chuck table 45c by the first feeding means 44a, to be held on the chuck table 45c. Then, grinding of the back side of the device D mounted on the wiring board 2 held on the chuck table 45b is started.

Then, with the turntable 46 rotated further in the same direction, the wiring board 2 on which the ground devices D are mounted and which is held by the chuck table 45a is moved into the vicinity of the second feeding means 44b. Upon this, the second feeding means 44b sucks the wiring board 2 thereto, and feeds the wiring board 2 to the cleaning means 43. At the cleaning means 43, the wiring board 2 is held on a spinner table 430, the spinner table 430 is rotated and, at the same time, cleaning water at a high pressure is jetted to the wiring board 2 and the devices D, to remove the chips generated upon grinding.

After the cleaning, the feeding-in/out means 41 holds the wiring board 2 and put it into the second cassette 40b. In this manner, the devices mounted on the wiring boards 2 held on the chuck tables 45a, 45b, 45c and 45d are sequentially ground to a desired thickness, and are sequentially contained into the second cassette 40b. Incidentally, the case where two grinding means are provided and grinding is conducted in two stages has been described in the above embodiment, one grinding means may be used to perform grinding one time.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A method of machining a wafer, for dividing a wafer in which a plurality of devices each having a low dielectric constant insulating film stacked on the face side thereof are formed in the state of being demarcated by planned dividing lines, into the individual devices and for causing said wafer to have a desired thickness, said method comprising:
   a dividing step for dividing said wafer into said individual devices;
   a bonding step for bonding electrodes of said divided devices to electrodes of a wiring board and for filling a gap between said wiring board and each said bonded device with a resin for sealing; and
   a device grinding step for holding on a chuck table of a grinding apparatus said wiring board with said devices bonded thereto, and moving said wiring board in a horizontal direction in such a manner that a grinding stone fixed at a predetermined height is brought into contact with each said device from the side of a side surface of said device to grind the back side of said device, thereby grinding said device by a desired amount, wherein said device grinding step includes a first grinding step for rough grinding each said device by using a rough grinding stone and a second grinding step for finish grinding each said device by using a finish grinding stone.

* * * * *